(12) United States Patent
Fan et al.

(10) Patent No.: US 10,727,317 B2
(45) Date of Patent: Jul. 28, 2020

(54) BOTTOM CONTACT FORMATION FOR VERTICAL TRANSISTOR DEVICES

(71) Applicant: INTERNATIONAL BUSINESS MACHINES CORPORATION, Armonk, NY (US)

(72) Inventors: Su Chen Fan, Cohoes, NY (US); Ekmini A. De Silva, Slingerlands, NY (US); Sivananda K. Kanakasabapathy, Pleasanton, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/151,701

(22) Filed: Oct. 4, 2018

(65) Prior Publication Data

US 2020/0111895 A1    Apr. 9, 2020

(51) Int. Cl.
*H01L 29/66* (2006.01)
*H01L 29/78* (2006.01)
*H01L 21/306* (2006.01)
*H01L 27/11* (2006.01)
*H01L 29/417* (2006.01)
*H01L 21/768* (2006.01)

(52) U.S. Cl.
CPC .. *H01L 29/66666* (2013.01); *H01L 21/30604* (2013.01); *H01L 21/76805* (2013.01); *H01L 27/1104* (2013.01); *H01L 29/41741* (2013.01); *H01L 29/7827* (2013.01)

(58) Field of Classification Search
CPC .......... H01L 29/66666; H01L 29/7827; H01L 21/30604; H01L 27/1104; H01L 29/41741; H01L 21/76805; H01L 29/66; H01L 29/78; H01L 21/306; H01L 27/11; H01L 29/417; H01L 21/768
USPC ........................................................ 257/329
See application file for complete search history.

(56) References Cited

U.S. PATENT DOCUMENTS

| 4,701,347 A | 10/1987 | Higashi |
| 6,022,794 A | 2/2000 | Hsu |
| 8,242,019 B2 | 8/2012 | Ishizaka et al. |
| 9,018,711 B1 | 4/2015 | Cai et al. |
| 9,251,888 B1 | 2/2016 | Liaw |

(Continued)

FOREIGN PATENT DOCUMENTS

CA    1270070 A    6/1990

OTHER PUBLICATIONS

Ulman, "Formation and Structure of Self-Assembled Monolayers", Chemical Reviews, vol. 96, No. 4, Jun. 1996, pp. 1533-1554.

(Continued)

*Primary Examiner* — Alexander O Williams
(74) *Attorney, Agent, or Firm* — Tutunjian & Bitetto, P.C.; Vazken Alexanian

(57) ABSTRACT

A method for fabricating a semiconductor device includes forming at least one contact trench corresponding to at least one bottom contact area associated with at least one vertical transistor, laterally etching through the at least one contact trench to form at least one bottom contact region corresponding to the at least one bottom contact area, and filling the at least one bottom contact region with a conductive material to form at least one bottom contact.

14 Claims, 5 Drawing Sheets

(56) References Cited

U.S. PATENT DOCUMENTS

| | | | |
|---|---|---|---|
| 9,576,959 B1 | 2/2017 | Dong et al. | |
| 9,595,473 B2 | 3/2017 | Chen et al. | |
| 9,601,497 B1 | 3/2017 | Chen et al. | |
| 9,831,317 B1 | 11/2017 | Zang et al. | |
| 9,929,048 B1* | 3/2018 | Xie | H01L 21/76897 |
| 10,134,739 B1* | 11/2018 | Zang | H01L 27/10814 |
| 10,361,315 B1* | 7/2019 | Yeh | H01L 29/66666 |
| 2007/0224763 A1* | 9/2007 | Fujimoto | H01L 21/3247 |
| | | | 438/259 |
| 2015/0021672 A1* | 1/2015 | Chuang | H01L 21/28088 |
| | | | 257/288 |
| 2017/0342553 A1 | 11/2017 | Yu et al. | |
| 2018/0247956 A1* | 8/2018 | Stamper | H01L 21/823468 |
| 2018/0277652 A1* | 9/2018 | Park | H01L 29/785 |
| 2018/0374899 A1* | 12/2018 | Yoshida | H01L 27/2454 |
| 2019/0006418 A1* | 1/2019 | Sel | H01L 45/1608 |
| 2019/0096904 A1* | 3/2019 | Noguchi | H01L 27/11575 |
| 2019/0103467 A1* | 4/2019 | Takaki | H01L 29/41741 |
| 2019/0189688 A1* | 6/2019 | Lille | H01L 45/1608 |
| 2019/0273144 A1* | 9/2019 | Leobandung | H01L 29/41733 |

OTHER PUBLICATIONS

Love, "Self-Assembled Monolayers of Thiolates on Metals as a Form of Nanotechnology", Chemical Reviews, vol. 105, No. 4, Apr. 2005, pp. 1103-1169.

* cited by examiner

BOTTOM CONTACT FORMATION FOR VERTICAL TRANSISTOR DEVICES

BACKGROUND

Technical Field

The present invention generally relates to semiconductor devices, and more particularly to vertical transistor devices and methods of fabricating the same.

Description of the Related Art

Vertical transistors, such as vertical field-effect transistors (FETs), have been devised as a way to reduce contact poly pitch (CPP) to decrease unit cell size and increase efficiency by orienting current flow vertically. Vertical transistors can provide for better electrostatic control of channels (e.g., gate-all-around channels). Further, since the ohmic contacts and the channels are aligned vertically, contact density per unit of surface area of a vertical transistor is higher than in a lateral transistor.

SUMMARY

In accordance an embodiment of the present invention, a method for fabricating a semiconductor device is provided. The method includes forming at least one contact trench corresponding to at least one bottom contact region associated with at least one vertical transistor, laterally etching through the at least one contact trench to form at least one bottom contact region corresponding to the at least one bottom contact area, and filling the at least one bottom contact region with a conductive material to form at least one bottom contact.

In accordance another embodiment of the present invention, a method for fabricating a semiconductor device is provided. The method includes forming at least one contact trench corresponding to at least one bottom contact area associated with at least one vertical transistor, including vertically etching to land on at least one substrate corresponding to at least one vertical transistor, laterally etching through the at least one contact trench using a wet etch process to form at least one bottom contact region corresponding to the at least one bottom contact area, filling the at least one bottom contact region with a conductive material to form at least one bottom contact, and forming a middle-of-the-line interlayer dielectric within the at least one contact trench to an exposed surface of the at least one bottom contact.

In accordance with yet another embodiment of the present invention, a semiconductor device is provided. The device includes at least one substrate associated with at least one vertical transistor, a middle-of-the-line interlayer dielectric, and a bottom contact disposed within the at least one substrate and under the middle-of-the-line interlayer dielectric.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
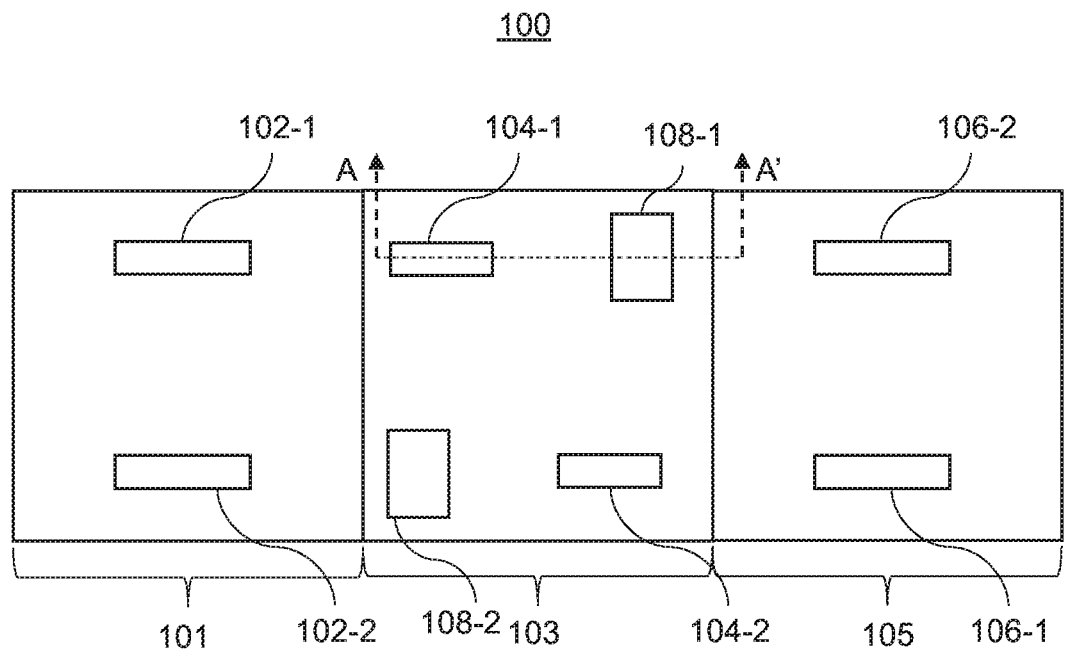
FIG. 1 is a top-down view of a semiconductor device including fin regions and bottom contact regions, in accordance with an embodiment of the present invention.

Bottom contact (e.g., bottom memory device contact) patterning and bottom contact metallization are steps included in a process flow for fabricating vertical transistor memory devices that can occur after fin formation, active area formation, bottom spacer formation and gate module formation. Contact spacing (e.g., bottom source/drain contact to gate, gate contact to fin, and gate contact to top source/drain contact) can limit the scalability of vertical transistor memory devices. For example, since the fin hard mask needs to be preserved for gate-middle or gate-last process integration, contact metallization should be free of chemical-mechanical planarization (CMP). Other approaches such as, e.g., direction metal deposition followed by organic planarization layer (OPL) recessing to remove metal on the field suffer drawbacks as well. For example, the process window can be extremely small as contact size can have a diameter ranging from, e.g., about 12 nm to about 14 nm.

To address at least the above scalability problems regarding memory devices including vertical transistors (e.g., VTFETs), the embodiments described herein provide for the formation of a bottom contact to improve scalability of memory devices.

For example, the device can include a p-plus (p+) region located between n-plus (n+) regions. The embodiments described herein can employ a lateral etch through the boundary of a p-type substrate of the p+ region and an n-type substrate of one of the n+ regions. The lateral etch can employ a wet etch process selective to the material of the shallow trench isolation (STI) region (e.g., selective to $SiO_2$). The bottom contact can be selectively formed (e.g., selectively grown) on top of metal and/or semiconductor material in the substrate (e.g., in a p-type substrate) for contact gate formation in vertical transistor contact formation. Accordingly, the bottom contact metallization can be performed without chemical-mechanical planarization (CMP) and/or organic planarization layer (OPL) recessing.

The bottom contact can be a buried three-dimensional contact structure that abuts gate conductor material and n-type/p-type substrate junction, which can connect the gate conductor material to both the p-type substrate and the n-type substrate. The bottom contact can be buried in pre-metal dielectric (PMD) material and/or under the middle-of-the-line (MOL) interlayer dielectric (ILD). A top source/drain contact can be formed on the top source/drain region, and can be extended to "fly-over" the bottom contact.

Exemplary applications/uses to which the present invention can be applied include the fabrication of a static random-access memory (SRAM) device formed from SRAM cells. As is known in the art, an SRAM cell is composed of transistors, which can include metal-oxide-semiconductor FETs (MOSFETs). For example, in a six transistor SRAM cell (i.e., a 6T SRAM cell), each bit is stored on four transistors that form cross-coupled inverters, and the other two transistors are access transistors that control access to a storage cell during read and write operations.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS.

is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top-down view of a semiconductor device 100 is provided. In one embodiment, the device 100 includes a memory device. For example, in this illustrative embodiment, the device 100 can include, e.g., a static random-access memory (SRAM) device.

The device 100 has a plurality of regions 101, 103 and 105 corresponding to respective semiconductor types. In this illustrative embodiment, regions 101 and 105 can each correspond to an n-plus (n+) region, and region 103 can correspond to a p-plus (p+) region. However, such an embodiment should not be considered limiting.

The region 101 is shown including fin regions 102-1 and 102-2, the region 103 is shown including fin regions 104-1 and 104-2, and the region 105 is shown including fin regions 106-1 and 106-2. Thus, in this illustrative embodiment, the device 100 includes a 6T SRAM device. In addition to the fin regions 104-1 and 104-2, the region 103 includes bottom contact areas 108-1 and 108-2 corresponding to areas where respective bottom contacts are to be formed. Further details regarding the fin regions 102-106 and the bottom contact areas 108-1 and 108-2 will be described below with reference to FIG. 2.

Figure 2:
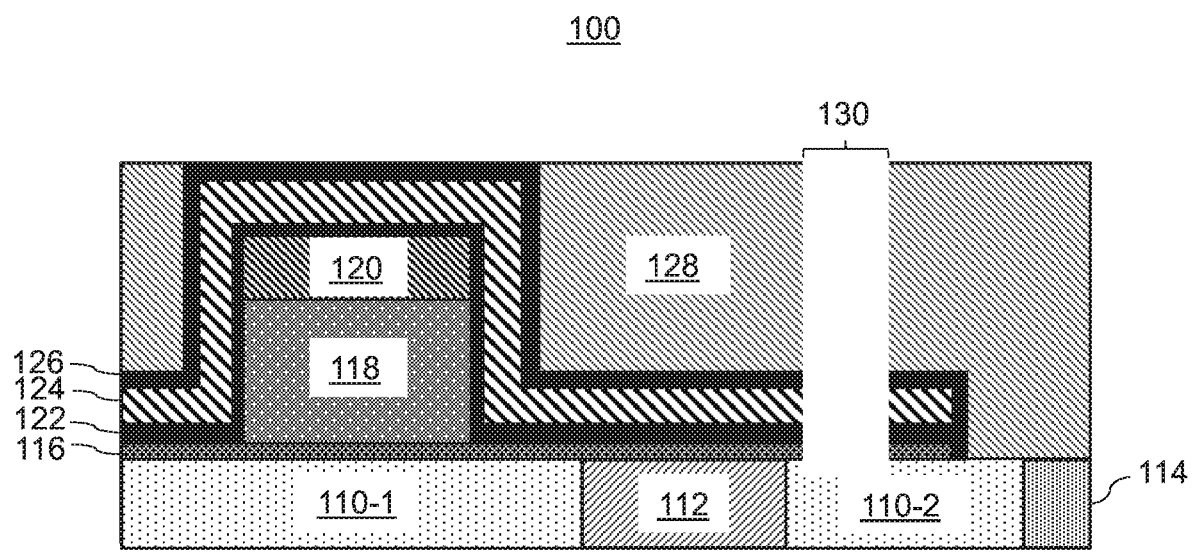
FIG. 2 is a cross-sectional view of a vertical contact etch performed during the fabrication of the semiconductor device, in accordance with an embodiment of the present invention.

With reference to FIG. 2, a cross-sectional view of the device 100 taken through line "A-A'" of the top-down view of FIG. 1 is provided illustrating a vertical contact etch corresponding to the bottom contact region 108-1 shown in FIG. 1. The cross-sectional view of FIG. 2 is taken through the region 103 and extends into the boundary of regions 103 and 105.

As shown, the device 100 includes a first substrate 110 having portions 110-1 and 110-2 separated by shallow trench isolation (STI) region 112, and a second substrate 114 adjacent to the substrate portion 110-2.

The first substrate 110 can correspond to a first semiconductor type and the second substrate 114 can correspond to a second semiconductor type. In this illustrative embodiment, the first substrate 110 corresponds to a p-type substrate and the second substrate 114 corresponds to an n-type substrate. The first and second substrates 110 and 114 can include any suitable substrate structure, e.g., a bulk semiconductor, a semiconductor-on-insulator (SOI) substrate, etc. In one example, the first and second substrates 110 and 114 can include a silicon-containing material. Illustrative examples of Si-containing materials suitable for the first and second substrates can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

The STI region 112 can be formed using any suitable process in accordance with the embodiments described herein. For example, the STI region 112 can be formed by etching a trench in the first substrate 110 utilizing an etch process such as, e.g., reactive-ion etching (RIE) or plasma etching, and filling the trench with a dielectric material using any suitable deposition process (e.g., chemical-vapor deposition (CVD)). The STI dielectric material can be densified after the filling. A planarization process (e.g., chemical-mechanical polishing (CMP)) can be used to provide a planar structure after the filling. The STI region 112 can include any suitable dielectric material in accordance with the embodiments described herein. For example, the STI region 112 can include an oxide material (e.g., silicon dioxide ($SiO_2$)).

As further shown, the device 100 further includes bottom spacer 116 formed over the first substrate portion 110-1, the STI region 112 and at least a portion of the first substrate portion 110-2. The bottom spacer 116 can include any suitable spacer material in accordance with the embodiments described herein. For example, the bottom spacer 116 can include, e.g., one or more silicon nitride materials (e.g., SiN, SiBCN, SiOC, SiOCN).

As further shown, the device 100 further includes a fin 118 and a fin hard mask 120 formed on the fin 118 formed using any suitable process in accordance with the embodiments described herein. The fin 118 and the fin hard mask 120 correspond to the fin region 104-1 shown in FIG. 1. The fin 118 and fin hard mask 120 can include any suitable material in accordance with the embodiments described herein. For example, the fin 118 can include, e.g., the same material as the first substrate 110 (e.g., Si). The fin hard mask 120 can include an organic hard mask material and/or an inorganic hard mask material. Examples of suitable materials for the fin hard mask 120 can include, but are not limited to, amorphous carbon, organo siloxane based materials, SiN, SiON, TiN, $SiO_2$, etc.

As further shown, the device 100 further includes a dielectric layer 122 formed using any suitable process in accordance with the embodiments described herein. The dielectric layer 122 can include any suitable material in accordance with the embodiments described herein. In one embodiment, the dielectric layer 122 includes a high-k dielectric material. A high-k dielectric material is dielectric material having a dielectric constant that is greater than $SiO_2$ at room temperature (e.g., about 20° C. to about 25° C.) and atmospheric pressure (1 atm). Examples of high-k dielectric materials can include, but are not limited to, hafnium oxides (e.g., $HfO_2$), hafnium silicates (e.g., $HfSiO_4$), titanium oxides (e.g., $TiO_2$), barium-strontium-titantates (BSTs), lead-zirconate-titanates (PZTs), etc.

As further shown, the device 100 further includes a gate structure having a gate conductor 124 and a gate dielectric 126 formed using any suitable process in accordance with the embodiments described herein. The gate conductor 124 can include any suitable material in accordance with the embodiments described herein. For example, the gate conductor 124 can include, e.g., a work function metal. Examples of suitable materials for the gate conductor 124 include, but are not limited to, a titanium nitride material (e.g., TiN) and a titanium carbide material (e.g., TiC). The gate dielectric 126 can include any suitable dielectric material in accordance with the embodiments described herein.

For example, the gate dielectric 126 can include, e.g., one or more silicon nitride materials (e.g., SiN, SiBCN, SiOC, SiOCN).

As further shown, the device 100 further includes an interlayer dielectric (ILD) 128 formed along the gate dielectric 126 and exposed portions of the first and second substrates 110 and 114 using any suitable process in accordance with the embodiments described herein. The ILD 128 can include any suitable dielectric material in accordance with the embodiments described herein. For example, the ILD 128 can include, e.g., $SiO_2$.

As further shown, a contact trench 130 corresponding to the bottom contact area 108-1 shown in FIG. 1 is formed. The contact trench 130 can be formed by vertically etching through the ILD 128, the gate dielectric 126, the gate conductor 124, the dielectric layer 122 and the bottom spacer 116, and landing on the first substrate portion 110-2. Any suitable etch process can be used to form the contact trench 130 (e.g., RIE).

Figure 3:
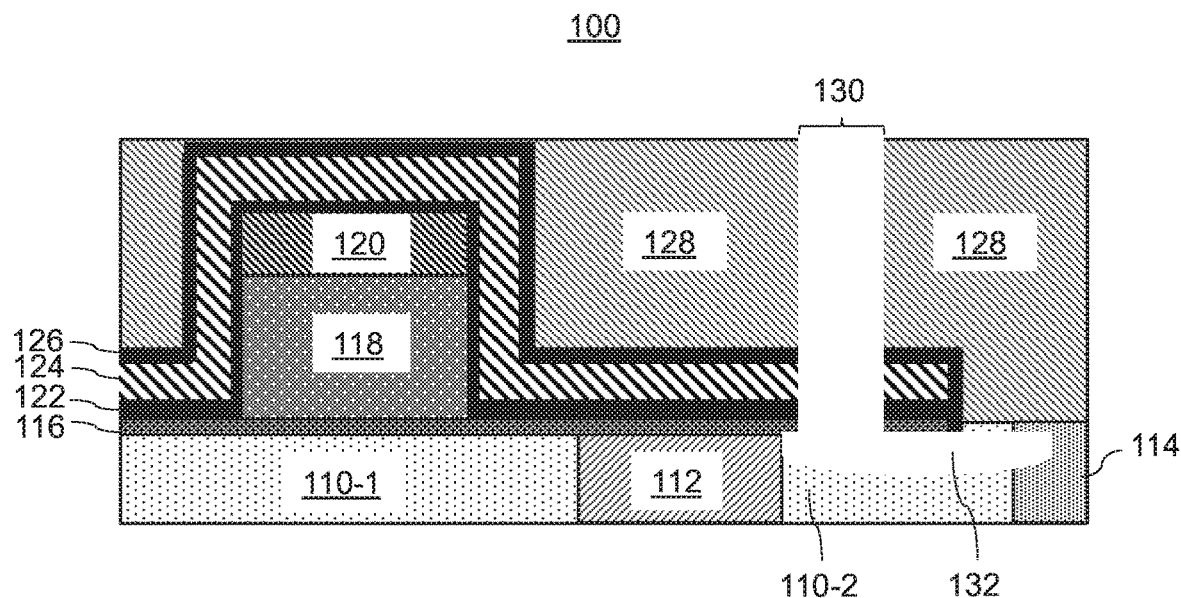
FIG. 3 is a cross-sectional view of a lateral contact etch performed during the fabrication of the semiconductor device, in accordance with another embodiment of the present invention.

With reference to FIG. 3, a bottom contact region 132 corresponding to the bottom contact area 108-1 is formed by laterally etching material from the substrates 110 and 114 through the contact trench 130. In one embodiment, laterally etching the material from the substrates 110 and 114 includes using a wet etch process. The wet etch process can utilize a wet etch chemistry selective to the isolation material (e.g., the STI 112). For example, the wet etch chemistry can include ammonium hydroxide ($NH_4OH$), followed by hydrochloric acid (HCl). As shown in FIG. 3, the lateral etch can remove material through the boundary or junction of the portion of the first substrate 110-2 and the second substrate 114.

Figure 4:
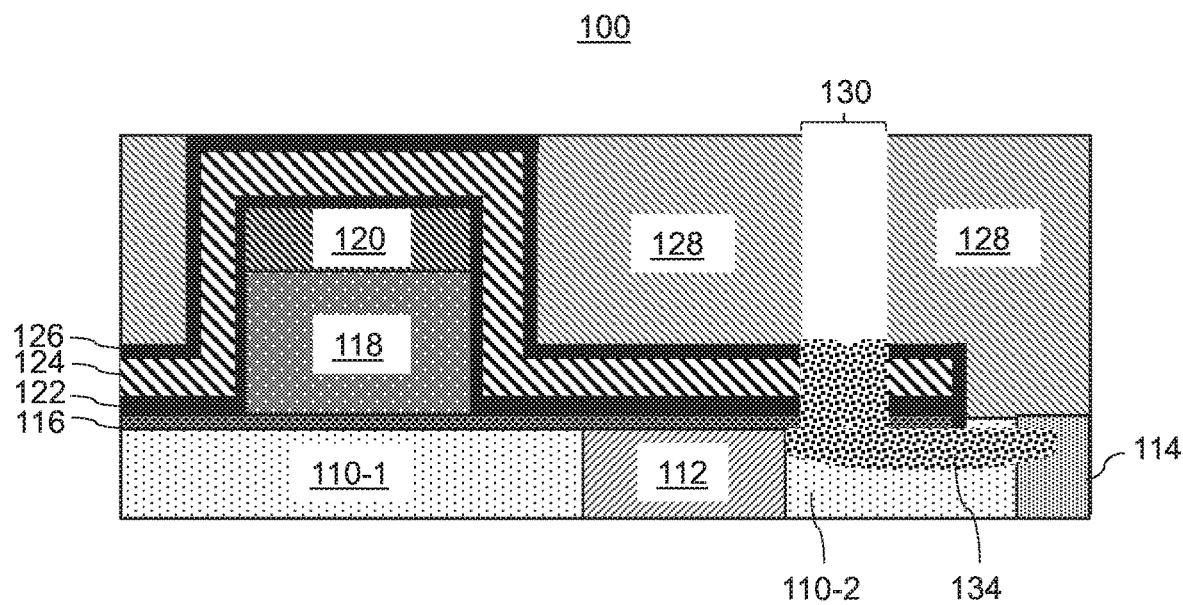
FIG. 4 is a cross-sectional view of selective metal growth during the fabrication of a semiconductor device, in accordance with an embodiment of the present invention.

With reference to FIG. 4, a bottom contact 134 is formed by filling the bottom contact region 132 and a portion of the trench 130 with a conductive material. In one embodiment, forming the bottom contact 134 can include selectively forming the conductive material of the bottom contact 134 on the gate conductor 124 (e.g., work function metal), the portion of the first substrate 110-2 and the second substrate 114. That is, the bottom contact 134 is not formed on dielectric material (e.g., the bottom spacer 116, the dielectric layer 122 and the gate dielectric 126 and the ILD 128).

In one embodiment, selectively forming the bottom contact 134 can include using a passivation layer that selectively binds to the dielectric material, and depositing a precursor on the non-dielectric material. The passivation layer prevents the precursor from depositing on the dielectric material, and thus prevents conductive material growth on the dielectric material.

In another embodiment, instead of using the passivation layer, selectively forming the bottom contact 134 can include choosing a precursor that has an inherent selectivity to the non-dielectric material and not the dielectric material, and depositing the precursor so that conductive material growth only occurs on the non-dielectric material.

The process used to selectively form the bottom contact 134 can be performed iteratively over a plurality of cycles to reach a desired thickness of the conductive material for the bottom contact 134. The process used to selectively form the bottom contact 134 can be optimized to ensure that virtually no conductive material growth occurs on the dielectric. For example, the process used to selectively form the bottom contact 134 can be optimized using a cleaning gas to ensure that no precursor is sticking to the dielectric material after multiple cycles.

Figure 5:
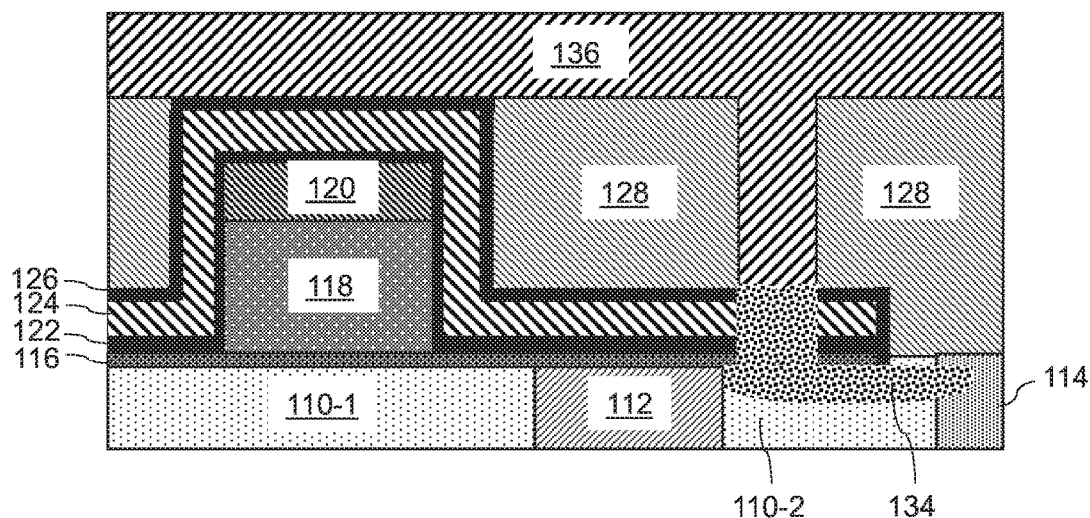
FIG. 5 is a cross-sectional view of the formation of an interlevel dielectric during the fabrication of the semiconductor device, in accordance with an embodiment of the present invention.

With reference to FIG. 5, a middle-of-the-line (MOL) ILD 136 is formed within the contact trench 130 to the exposed surface of the bottom contact using any suitable process in accordance with the embodiments described herein. As shown, the MOL ILD 136 can extend along the gate dielectric 126 and the ILD 128. The MOL ILD 136 can include any suitable dielectric material in accordance with the embodiments described herein. For example, the MOL ILD 136 can include, e.g., $SiO_2$. Accordingly, the bottom contact 134 can be buried under the MOL ILD 136.

Figure 6:
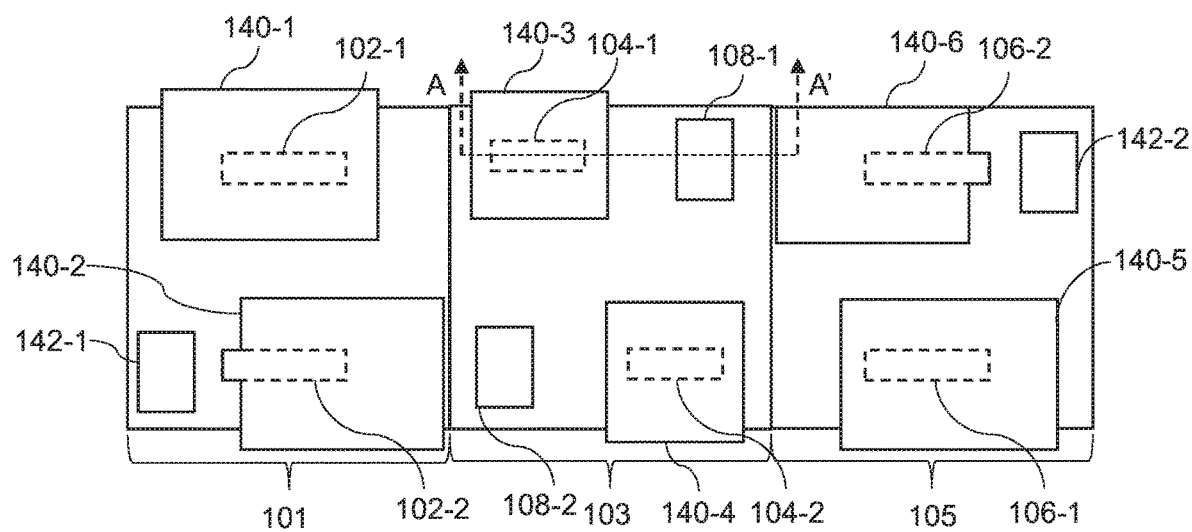
FIG. 6 is a top-down view of contacts formed during the fabrication of the semiconductor device, in accordance with an embodiment of the present invention.

With reference to FIG. 6, a top-down view of a semiconductor device 100 is provided illustrating the formation of MOL contacts in accordance with one embodiment, including contacts 140-1, 140-2 and 142-2 in region 101, contacts 140-3 and 140-4 in region 103, and contacts 140-5, 140-6 and 142-2 in region 105. Forming the MOL contacts can include patterning the contacts, and then metallizing to form the MOL contacts.

The contacts 140-1 through 140-6 can correspond to top source/drain contacts of respective vertical transistor devices. The contacts 142-1 and 142-1 can correspond to gate contacts of respective vertical transistor devices. The contacts 140-1 through 140-6, 142-1 and 142-2 can be formed using any suitable processes in accordance with the embodiments described herein and can include any suitable materials in accordance with the embodiments described herein. Examples of suitable materials include, but are not limited to, tungsten (W), cobalt (Co) and copper (Cu). Other contacts, such as, e.g., a contact to the second substrate 114 (not shown) can also be formed.

Figure 7:
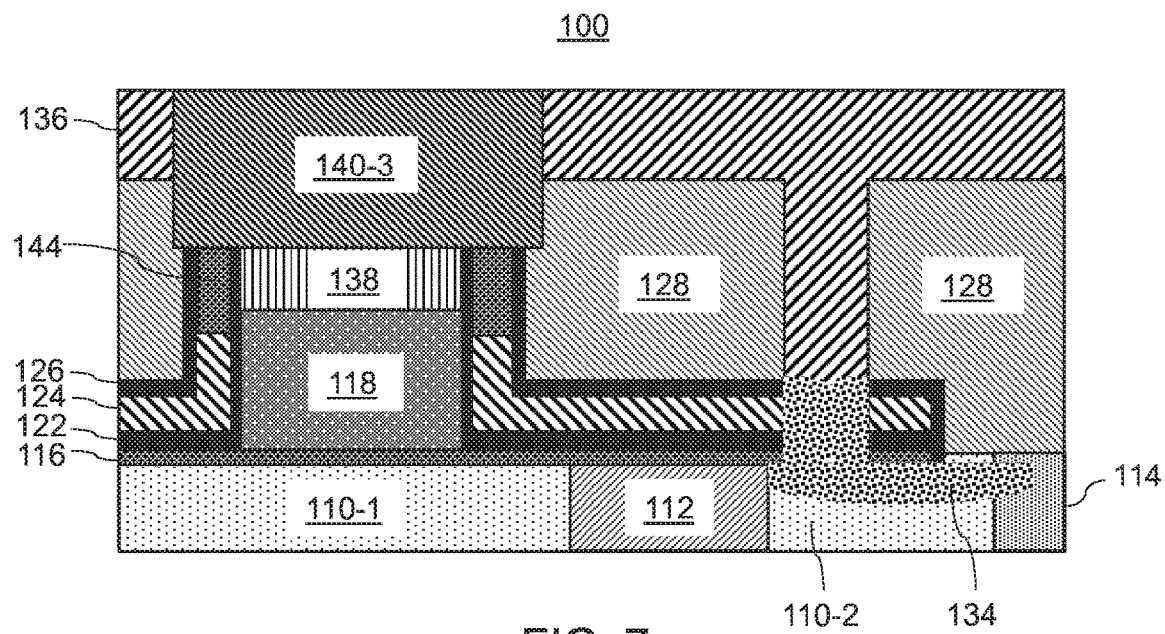
FIG. 7 is a cross-sectional view of a top source/drain contact formed during the fabrication of the semiconductor device, in accordance with an embodiment of the present invention.

With reference to FIG. 7, a cross-sectional view of the device 100 taken through line "A-A'" of the top-down view of FIG. 6 is provided. As shown, a top source/drain region is formed. The top source/drain region 138 can be formed by removing portions of the MOL ILD 136, gate dielectric 126, gate conductor 124 and dielectric layer 122, removing the fin hard mask 120, and forming the top source/drain region 138 on the fin 118. The top source/drain region 138 can include any suitable material in accordance with the embodiments described herein. For example, the top source/drain region can include an epitaxially formed or grown semiconductor material.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

As further shown, additional dielectric material 144 is formed adjacent to the top source/drain region 138, which can include any suitable dielectric material in accordance with the embodiments described herein. For example, the additional dielectric material 144 can include, e.g., one or more silicon nitride materials (e.g., SiN, SiBCN, SiOC, SiOCN).

Additionally, the contact 140-3 is shown formed on the top source/drain region 138. In an alternative embodiment, the top source/drain contact shown in FIG. 7 can be extended to "fly over" the bottom contact 134.

Figure 8:
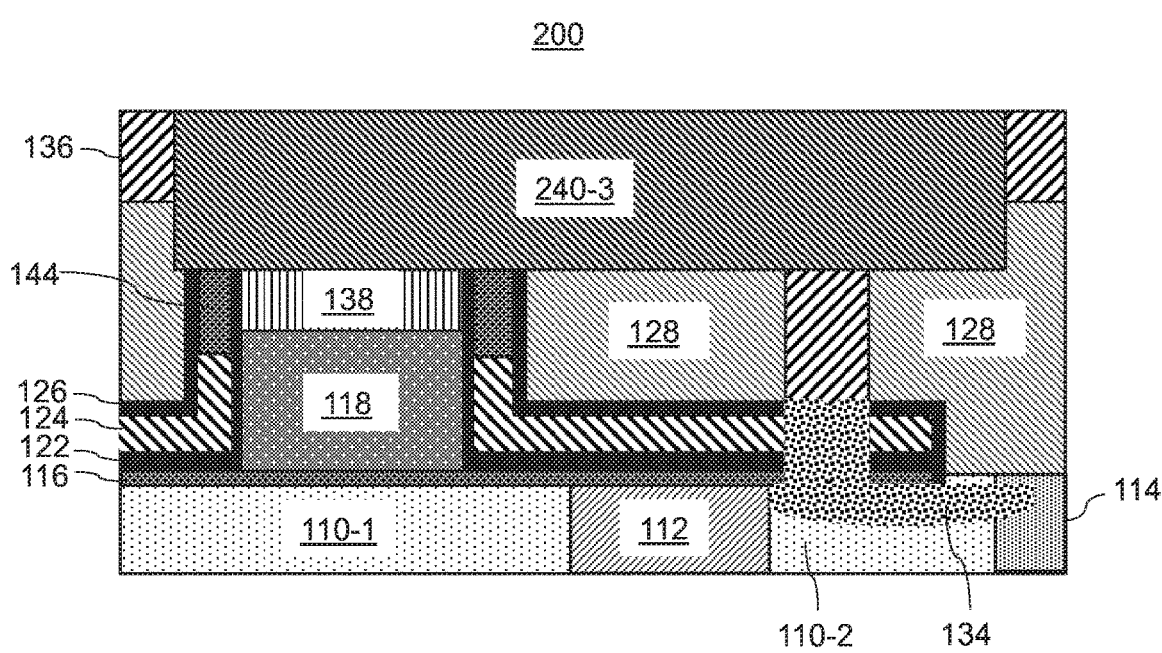
FIG. 8 is a cross-sectional view of a top source/drain contact formed during the fabrication of the device, in accordance with another embodiment of the present invention.

For example, with reference to FIG. 8, a cross-sectional view of a semiconductor device 200 is provided. As shown, the device 200 is similar to the device 100 shown in FIG. 7, except that the contact 140-3 of FIG. 7 is replaced with a contact 240-3 that extends over the bottom contact 134. As mentioned above, the bottom contact 134 is buried under so it is not taking any MOL ILD space, which can facilitate device area scaling (e.g., SRAM area scaling). Additionally, with respect to the embodiment shown in FIG. 8, this can allow the contact 240-3 to not be shorted to the gate structure or the bottom source/drain region.

Figure 9:
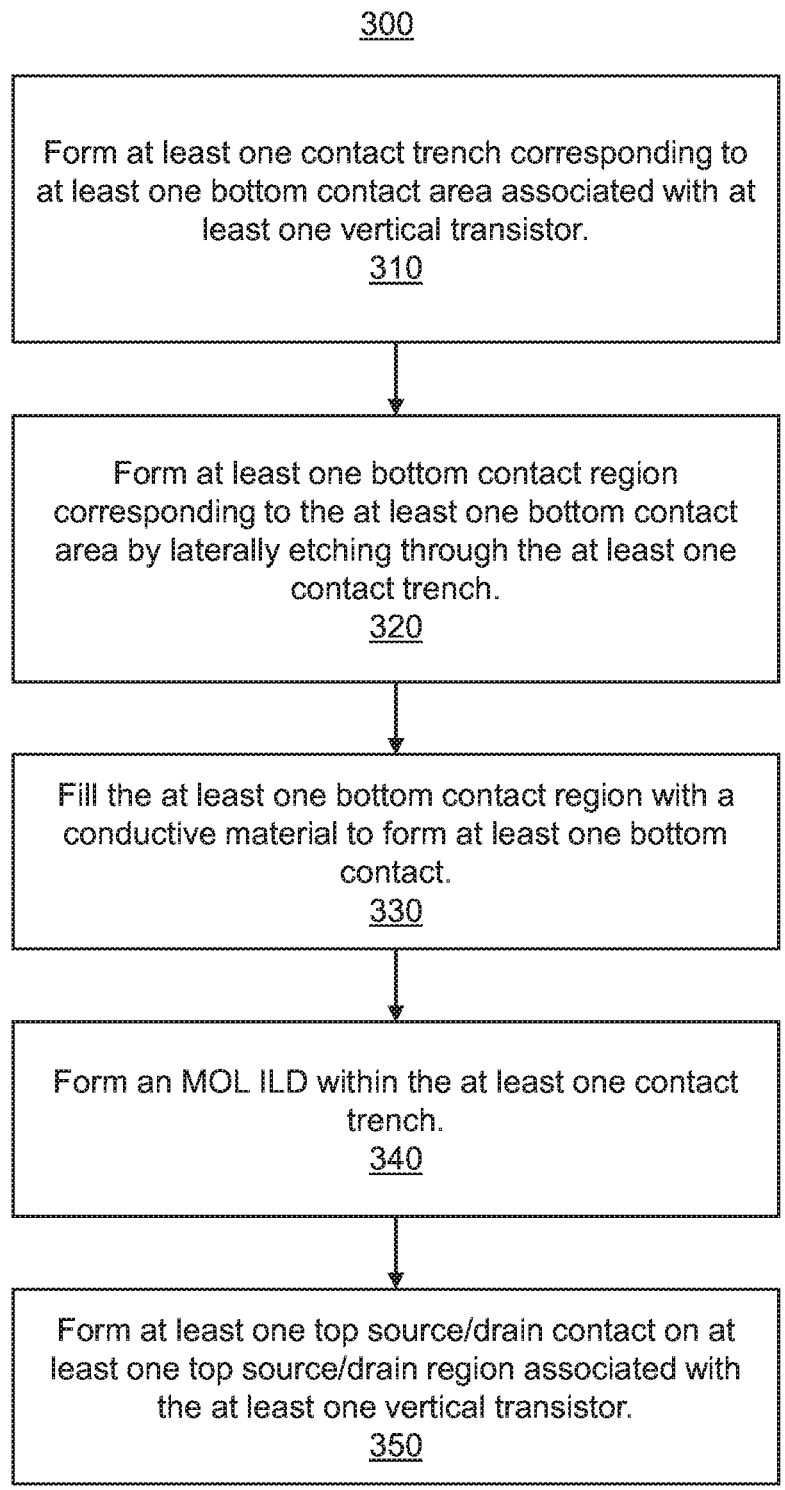
FIG. 9 is a block/flow diagram illustrating a system/method for fabricating a semiconductor device including memory pillar elements, in accordance with an embodiment of the present invention.

With reference to FIG. 9, a block/flow diagram is provided illustrating a system/method 300 for fabricating a semiconductor device.

At block 310, at least one contact trench corresponding to a bottom contact area associated with at least one vertical transistor (e.g., vertical FET) is formed. In one embodiment, forming the at least one contact trench includes vertically etching to land on at least one substrate corresponding to the at least one vertical transistor. In one embodiment, the at least one contact trench is formed on at least one substrate of at least one vertical transistor associated with one of a plurality of regions of the device. The plurality of regions can have alternating types, such that the region of the at least one contact trench is either a p+ region or an n+ region. In an illustrative embodiment, the plurality of regions includes three regions having alternating types, with each region including two fin structures. For example, the plurality of regions can include a first region having a first type, a second region adjacent to the first region having a second type, and a third region having the first type. In this illustrative embodiment, the plurality of regions can form a 6T memory cell (e.g., SRAM memory cell). The region of the at least one contact trench can illustratively be a p+ region located between n+ regions. However, such an arrangement should not be considered limiting.

At block 320, at least one bottom contact region corresponding to the at least one bottom contact area is formed by laterally etching through the at least one contact trench. In one embodiment, forming the at least one bottom contact region can include laterally etching the at least one substrate through the at least one contact trench using a wet etch process. The wet etch process can utilize a wet etch chemistry selective to isolation material in the region (e.g., STI). In the embodiment where the plurality of regions includes three regions having alternating types, the lateral etch can remove material through the boundary or junction of the region including the at least one bottom contact region and an adjacent region (e.g., remove material from at least one substrate of the adjacent region).

At block 330, the at least one bottom contact region is filled with a conductive material to form at least one bottom contact (e.g., bottom memory contact). The at least one bottom contact can be formed to include any suitable material in accordance with the embodiments described herein. For example, forming the at least one bottom contact can include selectively forming the conductive material on non-dielectric materials (e.g., selectively forming the conductive material on gate conductor material and substrate material) to fill the at least one bottom contact region.

In one embodiment, selectively forming the at least one bottom contact can include using a passivation layer that selectively binds to the dielectric material, and depositing a precursor on the non-dielectric material. The passivation layer prevents the precursor from depositing on the dielectric material, and thus prevents conductive material growth on the dielectric material.

In another embodiment, instead of using the passivation layer, selectively forming the at least one bottom contact can include choosing a precursor that has an inherent selectivity to the non-dielectric material and not the dielectric material, and depositing the precursor so that conductive material growth only occurs on the non-dielectric material.

The process used to selectively form the at least one bottom contact can be performed iteratively over a plurality of cycles to reach a desired thickness of the conductive material for the at least one bottom contact. The process used to selectively form the at least one bottom contact can be optimized to ensure that virtually no conductive material growth occurs on the dielectric. For example, the process used to selectively form the at least one bottom contact can be optimized using a cleaning gas to ensure that no precursor is sticking to the dielectric material after multiple cycles.

At block 340, an MOL ILD is formed within the at least one contact trench. The MOLD ILD can be formed to the exposed surface of the at least one bottom contact. Any suitable process can be used form the MOL ILD. The MOL ILD can be formed to include any suitable dielectric material in accordance with the embodiments described herein. For example, the MOL ILD can be formed to include, e.g., $SiO_2$. Accordingly, the at least one bottom contact can be buried under the MOL ILD.

At block 350, at least one top source/drain contact is formed on at least one top source/drain region associated with the at least one vertical transistor. In one embodiment, the at least one top source/drain contact can extended to be above the bottom contact (e.g., "fly over" the bottom contact).

Further details regarding blocks 310-350 of the system/method described with reference to FIG. 9 are provided above with reference to FIGS. 1-8.

The embodiments described herein with reference to FIGS. 1-9 can improve scalability for devices including vertical transistors (e.g., vertical transistor memory devices). For example, since the bottom contact can be buried in PMD material and/or MOL ILD material, the bottom contact can be formed to limit device space. The bottom contact can be a buried three-dimensional contact structure that abuts gate conductor material and n-type/p-type substrate junction, which can connect the gate conductor material to both the p-type substrate and the n-type substrate. A top source/drain contact can be formed on the top source/drain region, and can be extended to "fly-over" the bottom contact.

Having described preferred embodiments of a semiconductor device and a method of forming bottom contacts for vertical transistor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for fabricating a semiconductor device, comprising:
    forming at least one contact trench corresponding to at least one bottom contact area associated with at least one vertical transistor;
    laterally etching through the at least one contact trench to form at least one bottom contact region corresponding to the at least one bottom contact area; and
    filling the at least one bottom contact region with a conductive material to form at least one bottom contact.

2. The method of claim 1, wherein forming the at least one contact trench includes vertically etching to land on at least one substrate corresponding to the at least one vertical transistor.

3. The method of claim 1, wherein laterally etching through the at least one contact trench to form the at least one bottom contact region further includes using a wet etch process selective to isolation material.

4. The method of claim 1, wherein the at least one bottom contact region is formed through a boundary of adjacent regions of a memory cell.

5. The method of claim 4, wherein the memory cell includes a static random-access memory (SRAM) memory cell.

6. The method of claim 1, further comprising forming a middle-of-the-line interlayer dielectric within the at least one contact trench to an exposed surface of the at least one bottom contact.

7. The method of claim 6, further comprising forming at least one top source/drain contact on at least one top source/drain region associated with the at least one vertical transistor.

8. The method of claim 7, wherein forming the at least one top source/drain contact further includes extending the top source/drain contact above the at least one bottom contact.

9. A method for fabricating a semiconductor device, comprising:
    forming at least one contact trench corresponding to at least one bottom contact area associated with at least one vertical transistor, including vertically etching to land on at least one substrate corresponding to at least one vertical transistor;
    laterally etching through the at least one contact trench using a wet etch process to form at least one bottom contact region corresponding to the at least one bottom contact area;
    filling the at least one bottom contact region with a conductive material to form at least one bottom contact; and
    forming a middle-of-the-line interlayer dielectric within the at least one contact trench to an exposed surface of the at least one bottom contact.

10. The method of claim 9, wherein laterally etching through the at least one contact trench to form the at least one bottom contact region further includes using a wet etch process selective to isolation material.

11. The method of claim 9, wherein the at least one bottom contact region is formed through a boundary of adjacent regions of a memory cell.

12. The method of claim 11, wherein the memory cell includes a static random-access memory (SRAM) memory cell.

13. The method of claim 9, further comprising forming at least one top source/drain contact on at least one top source/drain region associated with the at least one vertical transistor.

14. The method of claim 13, wherein forming the at least one top source/drain contact further includes extending the top source/drain contact above the at least one bottom contact.

* * * * *